United States Patent
Fukuoka et al.

(10) Patent No.: US 8,351,881 B2
(45) Date of Patent: Jan. 8, 2013

(54) ADDITION CIRCUIT, POWER AMPLIFIER CIRCUIT USING SAME, AND TRANSMISSION DEVICE AND COMMUNICATION DEVICE USING THE POWER AMPLIFIER CIRCUIT

(75) Inventors: Yasuhiko Fukuoka, Tokyo (JP); Akira Nagayama, Tokyo (JP)

(73) Assignee: Kyocera Corporation, Kyoto (JP)

( * ) Notice: Subject to any disclaimer, the term of this patent is extended or adjusted under 35 U.S.C. 154(b) by 49 days.

(21) Appl. No.: 13/141,956

(22) PCT Filed: Dec. 22, 2009

(86) PCT No.: PCT/JP2009/071304
§ 371 (c)(1),
(2), (4) Date: Jun. 23, 2011

(87) PCT Pub. No.: WO2010/074069
PCT Pub. Date: Jul. 1, 2010

(65) Prior Publication Data
US 2011/0256839 A1    Oct. 20, 2011

(30) Foreign Application Priority Data
Dec. 24, 2008    (JP) ................................ 2008-326979

(51) Int. Cl.
*H01Q 11/12*    (2006.01)
*H04B 1/04*    (2006.01)

(52) U.S. Cl. ..................... 455/127.2; 455/110; 375/302; 327/356

(58) Field of Classification Search .................. 455/110, 455/112, 118, 127.1, 127.2; 375/302; 327/119.356
See application file for complete search history.

(56) References Cited

U.S. PATENT DOCUMENTS

| | | | |
|---|---|---|---|
| 5,535,247 A * | 7/1996 | Gailus et al. | 375/297 |
| 6,175,586 B1 * | 1/2001 | Lomp | 375/130 |
| 7,305,046 B2 * | 12/2007 | Gamm et al. | 375/296 |
| 7,460,614 B2 * | 12/2008 | Demir et al. | 375/298 |
| 7,567,610 B2 * | 7/2009 | Adan et al. | 375/219 |
| 7,697,486 B2 * | 4/2010 | Lee et al. | 370/335 |
| 2006/0099919 A1 | 5/2006 | Sorrells et al. | |

(Continued)

FOREIGN PATENT DOCUMENTS
JP    6-51002 A    2/1994
(Continued)

*Primary Examiner* — Quochien B Vuong
(74) *Attorney, Agent, or Firm* — Birch, Stewart, Kolasch & Birch, LLP

(57) ABSTRACT

Disclosed are an addition circuit that makes it possible to add two vector signals in a high-frequency region, a power amplifier circuit using the same, and a transmission device and communication device using the power amplifier circuit. Disclosed is an addition circuit, wherein first through fourth multipliers (11-14) multiply first and second high-frequency input signals (Si1, Si2) and first and second reference signals (Ref1, Ref2) and output first through fourth direct current output signals (Sd1-Sd4), first and second adders (21, 22) add in-phase signals of these to one another and output fifth and sixth direct current output signals (Sd5, Sd6), fifth and sixth multipliers (15, 16) multiply these and the first and second reference signals (Ref1, Ref2) and output first and second high-frequency output signals (So1, So2), which are then combined, whereby a third high-frequency output signal (So3), in which the first and second high-frequency input signals (Si1, Si2) have been vector added, is output from an output terminal (44). The addition circuit can be used in a high-frequency region.

6 Claims, 5 Drawing Sheets

U.S. PATENT DOCUMENTS

2007/0030063 A1    2/2007    Izumi et al.

FOREIGN PATENT DOCUMENTS

| | | |
|---|---|---|
| JP | 2005-151543 A | 6/2005 |
| JP | 2007-150905 A | 6/2007 |
| JP | 2008-518514 A | 5/2008 |
| WO | WO 2008/093404 A1 | 8/2008 |

* cited by examiner

ADDITION CIRCUIT, POWER AMPLIFIER CIRCUIT USING SAME, AND TRANSMISSION DEVICE AND COMMUNICATION DEVICE USING THE POWER AMPLIFIER CIRCUIT

TECHNICAL FIELD

The present invention relates to an addition circuit, a power amplifier circuit using the addition circuit, and a transmission device and a communication device each using the power amplifier circuit. More particularly, the present invention relates to an addition circuit capable of adding two high-frequency signals, a power amplifier circuit using the addition circuit, and a transmission device and a communication device each using the power amplifier circuit.

BACKGROUND ART

An addition circuit using an operational amplifier is widely employed as an addition circuit for obtaining an added signal of plural signals (see, e.g., Patent Literature 1).
Citation List
Patent Literature
  PTL 1: Japanese Unexamined Patent Application Publication No. 6-51002

SUMMARY OF INVENTION

Technical Problem
  However, an addition circuit using an operational amplifier has a problem that the addition circuit cannot be employed in a high-frequency range because it is operable just until a maximum operating frequency, which is determined depending on the product of the parasitic capacity and the feedback resistance of a transistor in the operational amplifier.
  The present invention has been accomplished in view of the problem described above, and an object of the present invention is to provide an addition circuit capable of adding two vector signals in a high-frequency range, a power amplifier circuit using the addition circuit, and a transmission device and a communication device each using the power amplifier circuit.
Solution to Problem
  An addition circuit according to the present invention includes a first multiplier multiplying a first high-frequency input signal, which is input to the first multiplier, by a first reference signal which is input to the first multiplier and which has a frequency equal to a frequency of the first high-frequency input signal, and outputting a first direct-current output signal, a second multiplier multiplying the first high-frequency input signal, which is input to the second multiplier, by a second reference signal which is input to the second multiplier and which has a phase advanced by 90° with respect to the first reference signal, and outputting a second direct-current output signal, a third multiplier multiplying a second high-frequency input signal, which is input to the third multiplier and which has a frequency equal to the frequency of the first high-frequency input signal, by the first reference signal which is input to the third multiplier, and outputting a third direct-current output signal, a fourth multiplier multiplying the second high-frequency input signal by the second reference signal, which are input to the fourth multiplier, and outputting a fourth direct-current output signal, a first adder adding the first direct-current output signal and the third direct-current output signal, which are input to the first adder, and outputting a fifth direct-current output signal, a second adder adding the second direct-current output signal and the fourth direct-current output signal, which are input to the second adder, and outputting a sixth direct-current output signal, a fifth multiplier multiplying the fifth direct-current output signal by the first reference signal, which are input to the fifth multiplier, and outputting a first high-frequency output signal, a sixth multiplier multiplying the sixth direct-current output signal by the second reference signal, which are input to the sixth multiplier, and outputting a second high-frequency output signal, and an output terminal connected to the fifth multiplier and the sixth multiplier and outputting a third high-frequency output signal resulting from adding the first high-frequency output signal and the second high-frequency output signal. With the addition circuit thus constructed, after converting each of the first high-frequency input signal and the second high-frequency input signal, both input to the addition circuit, to two direct-current signals which are respective direct-current components of quadrature signals, two pairs of direct-current signals obtained as direct-current components of the converted signals in phase with each other are added respectively in the first adder and the second adder, thereby producing two direct-current signals. Further, those two direct-current signals are converted to two quadrature high-frequency signals, which are then combined together, thereby obtaining the third high-frequency output signal that is a signal resulting from adding the first high-frequency input signal and the second high-frequency input signal. Thus, since the direct-current signals are added in each of the first adder and the second adder, the addition circuit capable of being satisfactorily used even in the high-frequency range can be obtained.
  Further, the above-described construction of the addition circuit according to the present invention may be modified such that the first adder adds the first direct-current output signal, the third direct-current output signal, and a first direct-current auxiliary signal which is input to the first adder, and outputs the fifth direct-current output signal, and that the second adder adds the second direct-current output signal, the fourth direct-current output signal, and a second direct-current auxiliary signal which is input to the second adder, and outputs the sixth direct-current output signal. With the addition circuit thus constructed, since the amplitude and the phase of the third high-frequency output signal can be changed by changing voltages of the first direct-current auxiliary signal and the second direct-current auxiliary signal. Therefore, the addition circuit capable of controlling the amplitude and the phase of the third high-frequency output signal is obtained.
  A power amplifier circuit according to the present invention includes a constant envelope signal generating circuit converting an input signal, which has an envelop variation, to two constant envelope signals and outputting the two constant envelope signals, two amplifiers amplifying and outputting respectively the two input constant envelope signals, and the addition circuit having one of the above-described constructions according to the present invention, which receives the two constant envelope signals after being amplified, respectively, as the first high-frequency input signal and the second high-frequency input signal. With the power amplifier circuit thus constructed, a nonlinear amplifier with high power addition efficiency can be used as each of the two amplifiers. Therefore, the power amplifier circuit capable of amplifying the input signal having an envelop variation with high power addition efficiency and capable of being satisfactorily used even in the high-frequency range is obtained.
  In a transmission device according to the present invention, a transmission circuit is connected to an antenna through the above-described power amplifier circuit according to the present invention. With the transmission device thus constructed, a transmission signal output from the transmission circuit and having an envelop variation can be amplified by using the power amplifier circuit according to the present invention, which can be satisfactorily used even in the high-frequency range and which has high power addition efficiency. Therefore, the transmission device capable of being satisfactorily used even in the high-frequency range and consuming less power is obtained.

In a communication device according to the present invention, a transmission circuit and a reception circuit are connected to an antenna, and the above-described power amplifier circuit according to the present invention is interposed between the transmission circuit and the antenna. With the communication device thus constructed, a transmission signal output from the transmission circuit and having an envelop variation can be amplified by using the power amplifier circuit according to the present invention, which can be satisfactorily used even in the high-frequency range and which has high power addition efficiency. Therefore, the transmission device capable of being satisfactorily used even in the high-frequency range and consuming less power is obtained.

Advantageous Effects of Invention

The addition circuit according to the present invention can be obtained as an addition circuit capable of being satisfactorily employed even in the high-frequency range.

The power amplifier circuit according to the present invention can be obtained as a power amplifier circuit capable of amplifying an input signal having an envelop variation with high power added efficiency, and capable of being employed even in the high-frequency range.

The transmission device and the communication device according to the present invention can be obtained as a transmission device and a communication device each capable of being employed even in the high-frequency range and each consuming less power.

DESCRIPTION OF EMBODIMENT

An addition circuit according to the present invention and a transmission device and a communication device each using the addition circuit will be described in detail below with reference to the accompanying drawings.

First Example of Embodiment

Figure 1:
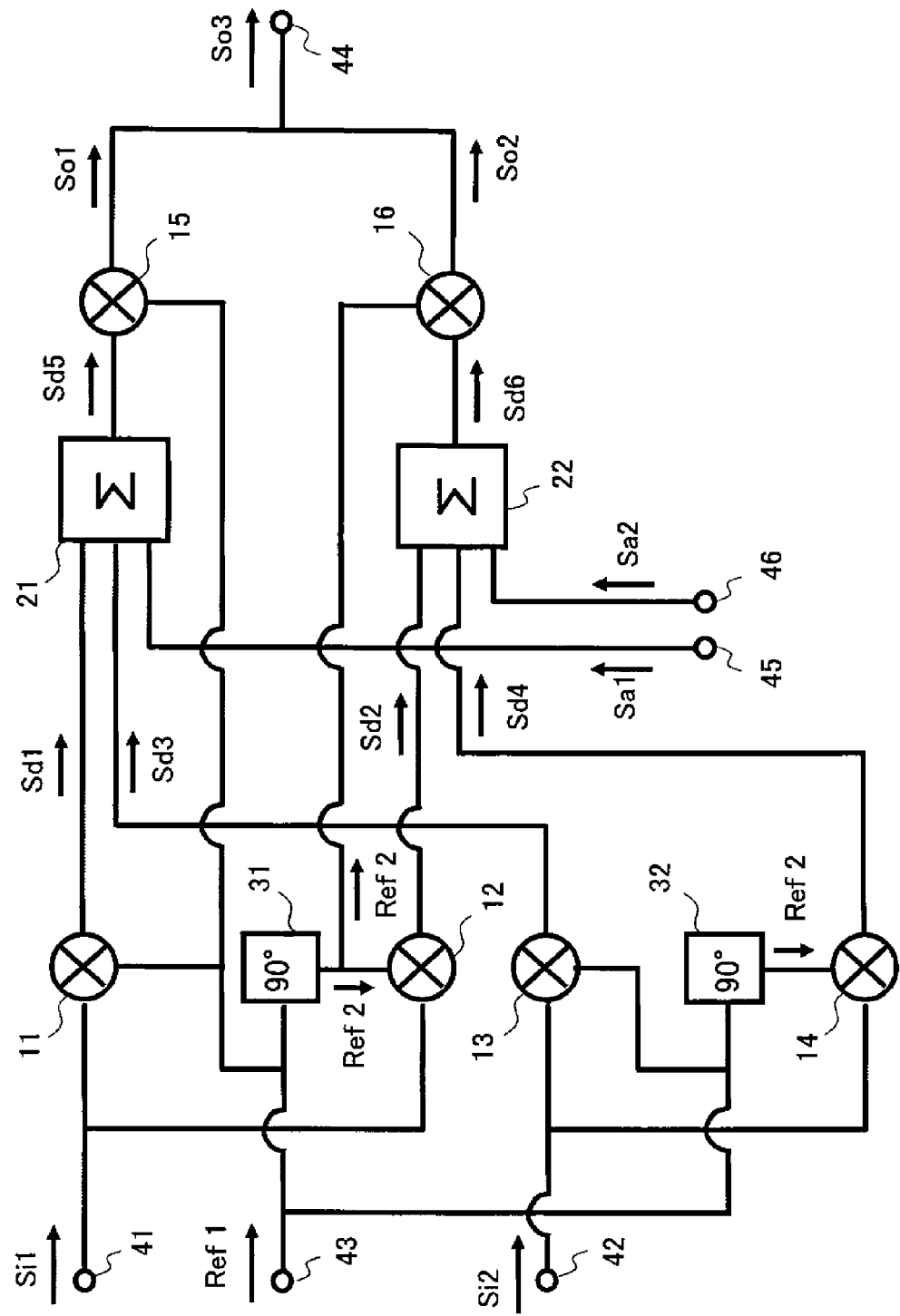
FIG. 1 is a block diagram illustrating one example of an embodiment of an addition circuit according to the present invention.

FIG. 1 is a block diagram illustrating one example of an embodiment of an addition circuit according to the present invention.

The addition circuit of this example includes, as illustrated in FIG. 1, a first input terminal 41, a second input terminal 42, a third input terminal 43, an output terminal 44, a first control terminal 45, a second control terminal 46, a first multiplier 11, a second multiplier 12, a third multiplier 13, a fourth multiplier 14, a fifth multiplier 15, a sixth multiplier 16, a first adder 21, a second adder 22, a phase shifter 31, and a phase shifter 32.

The first input terminal 41 is connected to the first multiplier 11 and the second multiplier 12, and the second input terminal 42 is connected to the third multiplier 13 and the fourth multiplier 14. The third input terminal 43 is connected to the first multiplier 11, the third multiplier 13, the fifth multiplier 15, and the phase shifters 31, 32. The phase shifter 31 is connected to the second multiplier 12 and the sixth multiplier 16, and the phase shifter 32 is connected to the fourth multiplier 14. The first multiplier 11, the third multiplier 13, and the first control terminal 45 are connected to the first adder 21, and the first adder 21 is connected to the fifth multiplier 15. The second multiplier 12, the fourth multiplier 14, and the second control terminal 46 are connected to the second adder 22, and the second adder 22 is connected to the sixth multiplier 16. Further, the fifth multiplier 15 and the sixth multiplier are connected to the output terminal 44.

The operation of the addition circuit of this example will be described below. In the addition circuit of this example, a first high-frequency input signal Si1 to be added is input to the first input terminal 41, a second high-frequency input signal Sit to be added is input to the second input terminal 42, and a first reference signal Ref1 is input to the third input terminal 43. The first high-frequency input signal Si1 is input to the first multiplier 11 and the second multiplier 12 through the first input terminal 41. The second high-frequency input signal Si2 is input to the third multiplier 13 and the fourth multiplier 14 through the second input terminal 42. The first reference signal Ref1 is input to the first multiplier 11 and the third multiplier 13 through the first input terminal 43. The first reference signal Ref1 is further input to the phase shifters 31, 32. After being phase-shifted by the phase shifters 31, 32, the first reference signal Ref1 is output as a second reference signal Ref2 having a phase advanced by 90° from that of the first reference signal Ref1. The second reference signal Ref2 is input to the second multiplier 12 and the fourth multiplier 14.

The first high-frequency input signal Si1, the second high-frequency input signal Si2, the first reference signal Ref1, and the second reference signal Ref2 are signals having the same frequency. Those signals can be expressed, for example, as follows; the first high-frequency input signal $Si1 = A(t) \cos(\omega t + \theta_A(t))$, the second high-frequency input signal $Si2 = B(t) \cos(\omega t + \theta_B(t))$, the first reference signal $Ref1 = \cos \omega t$, and the second reference signal $Ref2 = \sin \omega t$. Here, $A(t)$ represents a time function of amplitude of the first high-frequency input signal Si1, and $\theta_A(t)$ represents a time function of phase of the first high-frequency input signal Si1. $B(t)$ represents a time function of amplitude of the second high-frequency input signal Si2, and $\theta_B(t)$ represents a time function of phase of the second high-frequency input signal Si2.

The first multiplier 11 multiplies the first high-frequency input signal Si1 by the first reference signal Ref1, both input to the first multiplier 11, and obtains a signal expressed by $(1/2)A(t)(\cos(2\omega t + \theta_A(t)) + \cos(\theta_A(t)))$. However, harmonic components are removed by a harmonic suppression circuit employing a capacitor in the first multiplier 11, and a first direct-current (DC) output signal $Sd1 = (1/2)A(t) \cos(\theta_A(t))$ is output from the first multiplier 11. Also, the second multiplier 12 multiplies the first high-frequency input signal Si1 by the second reference signal Ref2, both input to the second multiplier 12, and obtains a signal expressed by $(½)A(t) ( \sin (2\omega t+\theta_A(t))-\sin (\theta_A(t)))$. However, harmonic components are removed by a harmonic suppression circuit employing a capacitor in the second multiplier 12, and a second direct-current (DC) output signal $Sd2=(-½)A(t) \sin (\theta_A(t))$ is output from the second multiplier 12. Thus, the first high-frequency input signal Si1 is decomposed to two DC signals on the basis of the first reference signal Ref1.

Similarly, the third multiplier 13 multiplies the second high-frequency input signal Si2 by the first reference signal Ref1, both input to the third multiplier 13, and obtains a signal expressed by $(½)B(t)( \cos (2\omega t+\theta_B(t))+\cos (\theta_B(t)))$. However, harmonic components are removed by a harmonic suppression circuit employing a capacitor in the third multiplier 13, and a third direct-current (DC) output signal $Sd3=(½)B(t) \cos (\theta_B(t))$ is output from the third multiplier 13. Also, the fourth multiplier 14 multiplies the second high-frequency input signal Si2 by the second reference signal Ref2, both input to the fourth multiplier 14, and obtains a signal expressed by $(½)B(t)( \sin (2\omega t+\theta_B(t))-\sin (\theta_B(t)))$. However, harmonic components are removed by a harmonic suppression circuit employing a capacitor in the fourth multiplier 14, and a fourth direct-current (DC) output signal $Sd4=(-½)B(t) \sin (\theta_B(t))$ is output from the fourth multiplier 14. Thus, the second high-frequency input signal Si2 is decomposed to two DC signals on the basis of the first reference signal Ref1.

The first DC output signal Sd1 and the third DC output signal Sd3 are input to the first adder 21, and the second DC output signal Sd2 and the fourth DC output signal Sd4 are input to the second adder 22. The first adder 21 adds the first DC output signal Sd1 and the third DC output signal Sd3, both input to the first adder 21, and outputs a fifth direct-current (DC) output signal Sd5. The second adder 22 adds the second DC output signal Sd2 and the fourth DC output signal Sd4, both input to the second adder 22, and outputs a sixth direct-current (DC) output signal Sd6. Herein, because each of the first adder 21 and the second adder 22 just adds DC voltages, each adder can be provided, for example, as a gain-constant adder using an ordinary operational amplifier.

The fifth DC output signal Sd5 is input to the fifth multiplier 15 along with the first reference signal Ref1, and the sixth DC output signal Sd6 is input to the sixth multiplier 16 along with the second reference signal Ref2. The fifth multiplier 15 multiplies the fifth DC output signal Sd5 by the first reference signal Ref1, both input to the fifth multiplier 15, and outputs a first high-frequency output signal So1. The sixth multiplier 16 multiplies the sixth DC output signal Sd6 by the second reference signal Ref2, both input to the sixth multiplier 16, and outputs a second high-frequency output signal So2. The first high-frequency output signal So1 is a component of a signal obtained through vector addition of the first high-frequency input signal Si1 and the second high-frequency input signal Si2, which component is in phase with the first reference signal Ref1. The second high-frequency output signal So2 is a component of the signal obtained through the vector addition of the first high-frequency input signal Si1 and the second high-frequency input signal Si2, which component is orthogonal with respect to the first reference signal Ref1. In other words, the first high-frequency output signal So1 and the second high-frequency output signal So2 are quadrature signals.

The first high-frequency output signal So1 and the second high-frequency output signal So2 are combined together and output as a third high-frequency output signal So3 from the output terminal 44. Thus, the third high-frequency output signal So3 can be obtained as a signal resulting from the vector addition of the first high-frequency input signal Si1 and the second high-frequency input signal Si2. Be it noted that, in the addition circuit of this example, the first to sixth multipliers 11 to 16 can be each provided as a mixer, e.g., a Gilbert cell mixer.

With the above-described addition circuit according to the present invention, after converting each of the first high-frequency input signal Si1 and the second high-frequency input signal Si2, both input to the addition circuit, to two DC signals which are respective DC components of quadrature signals, two pairs of DC signals obtained as DC components of the converted signals in phase with each other are added respectively in the first adder 21 and the second adder 22, thereby producing two DC signals. Further, those two DC signals are converted to two quadrature high-frequency signals, which are then combined together, thereby obtaining the third high-frequency output signal So3, i.e., the signal resulting from the vector addition of the first high-frequency input signal Si1 and the second high-frequency input signal Si2. Since the DC signals are added in each of the first adder 21 and the second adder 22, the addition circuit capable of being satisfactorily used even in the high-frequency range can be obtained. Further, since two multipliers are arranged between the output terminal 44 and each of the first input terminal 41 and the second input terminal 42, impedance is sufficiently high when the first input terminal 41 and the second input terminal 42 are viewed from the output terminal 44. As a result, the vector addition of the first high-frequency input signal Si1 and the second high-frequency input signal Si2 can be satisfactorily preformed without being affected by the impedances of external circuits connected to the first input terminal 41 and the second input terminal 42.

Moreover, in the addition circuit of this example, the first control terminal 45 is connected to the first adder 21, and a first direct-current (DC) auxiliary signal Sa1 is input to the first adder 21 through the first control terminal 45. The second control terminal 46 is connected to the second adder 22, and a second direct-current (DC) auxiliary signal Sa2 is input to the second adder 22 through the second control terminal 46. The first adder 21 adds the first DC output signal Sd1, the third DC output signal Sd3, and the first DC auxiliary signal Sa1, and outputs the fifth DC output signal Sd5. The second adder 22 adds the second DC output signal Sd2, the fourth DC output signal Sd4, and the second DC auxiliary signal Sa2, and outputs the sixth DC output signal Sd6.

With the above-described addition circuit according to the present invention, voltages of the first DC output signal Sd1 and the second DC output signal Sd2 can be changed respectively by changing voltages of the first DC auxiliary signal Sa1 and the second DC auxiliary signal Sa1. Therefore, the amplitudes of the first high-frequency output signal So1 and the second high-frequency output signal So2 can also be changed. In other words, the amplitudes of the first high-frequency output signal So1 and the second high-frequency output signal So2, i.e., the amplitudes of two quadrature components constituting the third high-frequency output signal So3, can be separately controlled by using the first DC auxiliary signal Sa1 and the second DC auxiliary signal Sa2, respectively. As a result, the amplitude and the phase of the third high-frequency output signal So3 can be arbitrarily controlled. This enables, for example, error correction of the third high-frequency output signal So3 to be easily performed.

Second Example of Embodiment

Figure 2:
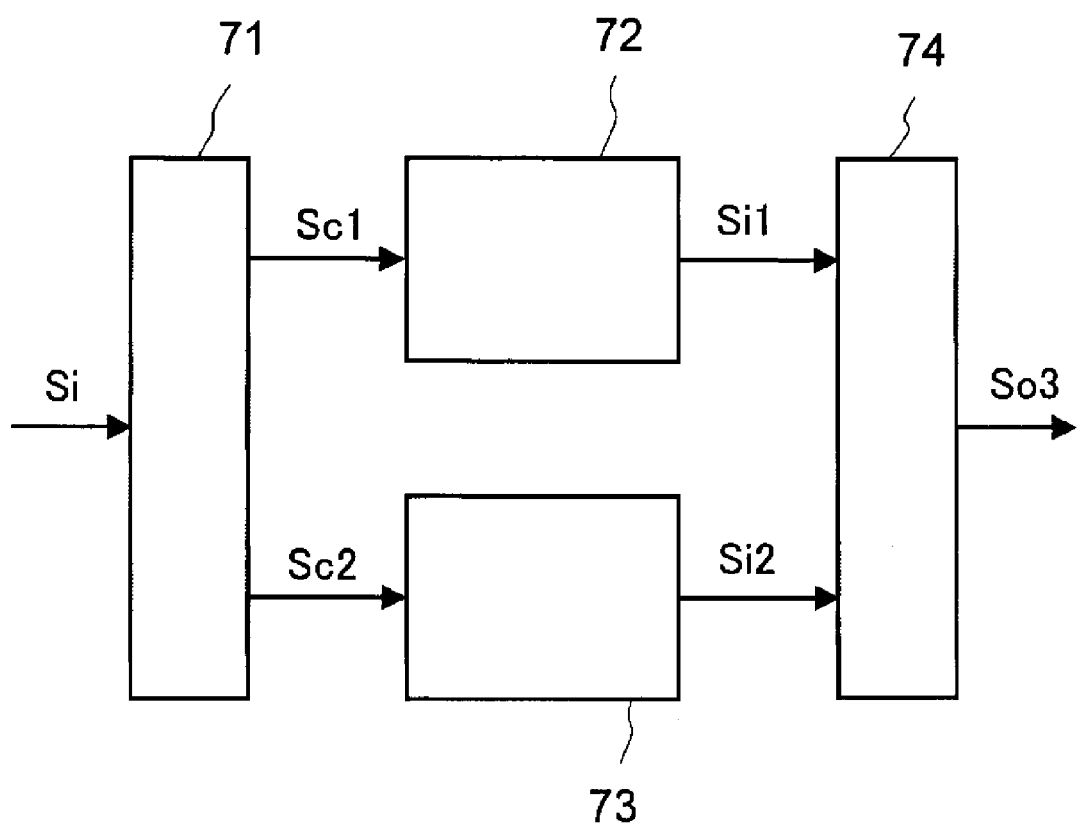
FIG. 2 is a block diagram illustrating one example of an embodiment of a power amplifier circuit using the addition circuit according to the present invention.

FIG. 2 is a block diagram illustrating one example of an embodiment of a power amplifier circuit according to the present invention.

The power amplifier circuit of this example includes, as illustrated in FIG. 2, a constant envelope signal generating circuit 71 for converting an input signal Si, which has an envelop variation, to a first constant envelope signal Sc1 and a second constant envelope signal Sc2 and outputting the converted signals, two amplifiers 72, 73 for respectively amplifying and outputting the two constant envelope signals input thereto, and an addition circuit 74 according to the present invention, which receives the two constant envelope signals after being amplified, respectively, as the first high-frequency input signal Si1 and the second high-frequency input signal Si2, and which outputs the third high-frequency output signal So3 as an output signal.

The power amplifier circuit of this example is a power amplifier circuit of LINC (Linear Amplification with Nonlinear Component) type. The constant envelope signal generating circuit 71 can be provided as suitable one of various constant envelope signal generating circuits which are used in the power amplifier circuit of LINC type for conversion of an input signal having an envelop variation to two constant envelope signals. The amplifiers 72 and 73 can be each provided as suitable one of general nonlinear amplifiers.

With the power amplifier circuit of this example, since a nonlinear amplifier with high power addition efficiency can be used as each of the amplifiers 72 and 73, the input signal having an envelop variation can be amplified with high power addition efficiency. Further, because of employing the addition circuit 74 according to the present invention, which can be satisfactorily used even in the high-frequency range and which can easily correct errors in the output signal, the power amplifier circuit capable of being satisfactorily used even in the high-frequency range and capable of easily correcting error in the output signal can be obtained.

Third Example of Embodiment

Figure 3:
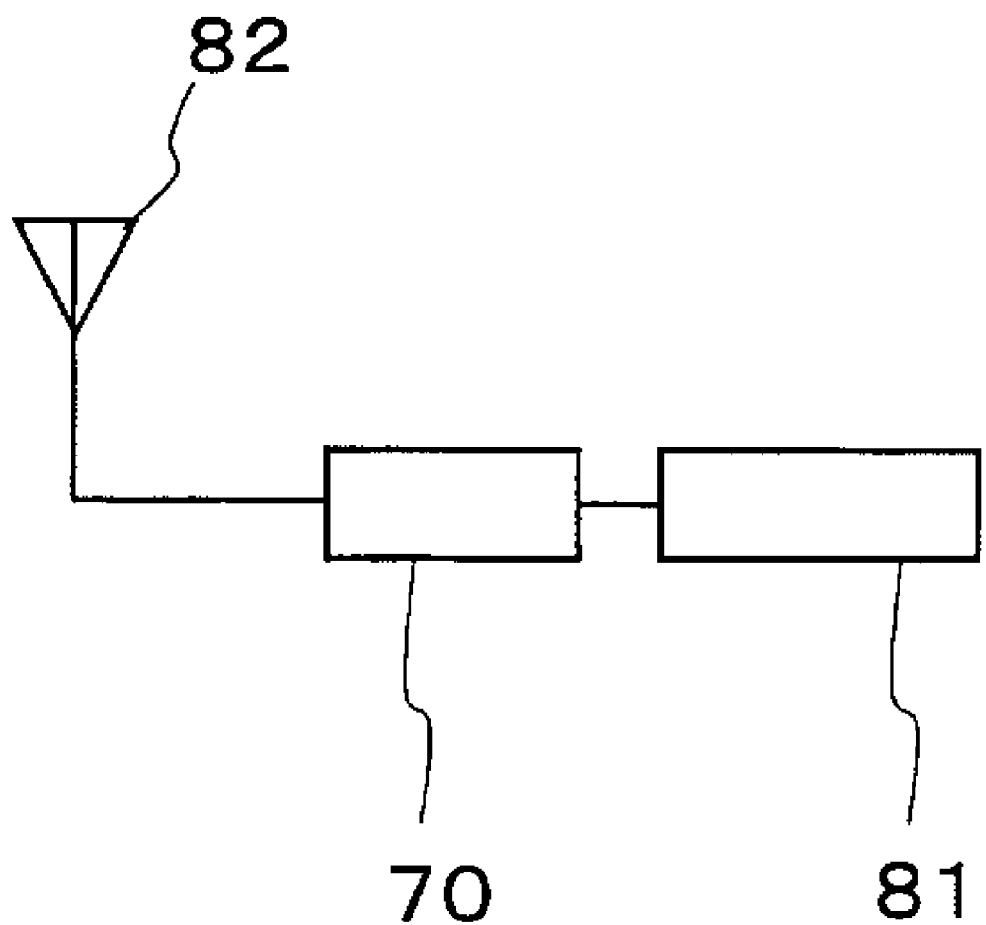
FIG. 3 is a block diagram illustrating one example of an embodiment of a transmission device using the power amplifier circuit according to the present invention.

FIG. 3 is a block diagram illustrating an example of configuration of a transmission device using the addition circuit according to the present invention.

In the transmission device of this example, as illustrated in FIG. 3, a transmission circuit 81 is connected to an antenna 82 through a power amplifier circuit 70 according to the present invention. With the thus-configured transmission device of this example, a transmission signal output from the transmission circuit 81 and having an envelop variation can be amplified by using the power amplifier circuit 70 according to the present invention, which can be satisfactorily used in the high-frequency range and which has high power addition efficiency. Therefore, the transmission device capable of being satisfactorily used in the high-frequency range and consuming less power can be obtained.

Fourth Example of Embodiment

Figure 4:
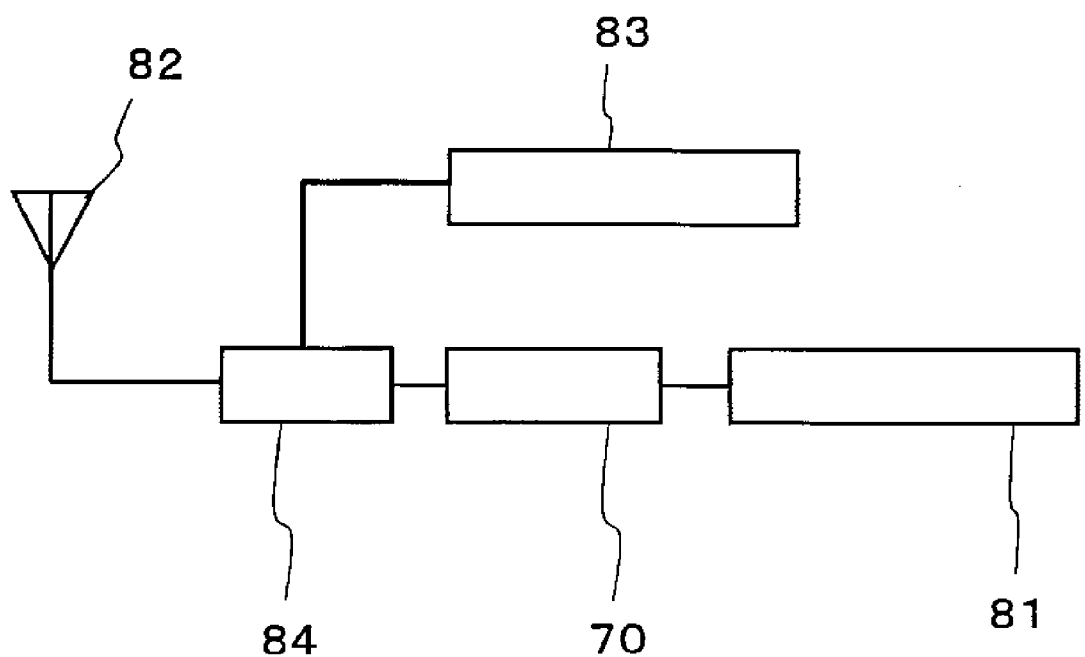
FIG. 4 is a block diagram illustrating one example of an embodiment of a communication device using the power amplifier circuit according to the present invention.

FIG. 4 is a block diagram illustrating an example of configuration of a communication device using the addition circuit according to the present invention.

In the communication device of this example, as illustrated in FIG. 4, a transmission circuit 81 and a reception circuit 83 are connected to an antenna 82, and a power amplifier circuit 70 according to the present invention is interposed between the transmission circuit 81 and the antenna 82. Further, an antenna sharing circuit 84 is interposed between the antenna 82 and each of the power amplifier circuit 70 and the reception circuit 83. With the thus-configured communication device of this example, a transmission signal output from the transmission circuit 81 and having an envelop variation can be amplified by using the power amplifier circuit 70 according to the present invention, which can be satisfactorily used in the high-frequency range and which has high power addition efficiency. Therefore, the communication device capable of being satisfactorily used in the high-frequency range and consuming less power can be obtained.

(Modifications)

The present invention is not limited to the above-described examples of the embodiment and can be variously modified and improved without departing from the gist of the present invention.

For example, while, in the above-described addition circuit of the first example of the embodiment, the first reference signal Ref1 is converted to the second reference signal Ref2 by using the first phase shifter 31 and the second phase shifter 32, the first reference signal Ref1 and the second reference signal Ref2 may be input separately. In such a case, the first phase shifter 31 and the second phase shifter 32 can be dispensed with. Further, when the error correction, etc. of the third high-frequency output signal So3 is not necessary, the first control terminal 45 and the second control terminal 46 can be dispensed with.

Further, while, in the above-described addition circuit of the first example of the embodiment, the harmonic suppression circuit (not shown) using a capacitor is disposed in each of the first to sixth multipliers 11 to 16, the harmonic suppression circuit may be disposed at other places within the addition circuit, e.g., between each of the first to sixth multipliers 11 to 16 and corresponding one of the first and second adders 21, 22. Alternatively, the harmonic suppression circuit may be disposed in an external circuit, or it may be dispensed with when harmonic waves are not problematic.

EXAMPLE

EXAMPLE of the addition circuit according to the present invention will be described below.

The operation of a circuit obtained by excluding the first control terminal 45, the second control terminal 46, and interconnection lines between those terminals 45, 46 and the first and second adders 21, 22 from the addition circuit of the first example of the embodiment, illustrated in FIG. 1, was confirmed through a simulation. Frequencies of the first high-frequency input signal Si1, the second high-frequency input signal Si2, and the first reference signal Ref1 were set to 1 GHz.

Figure 5:
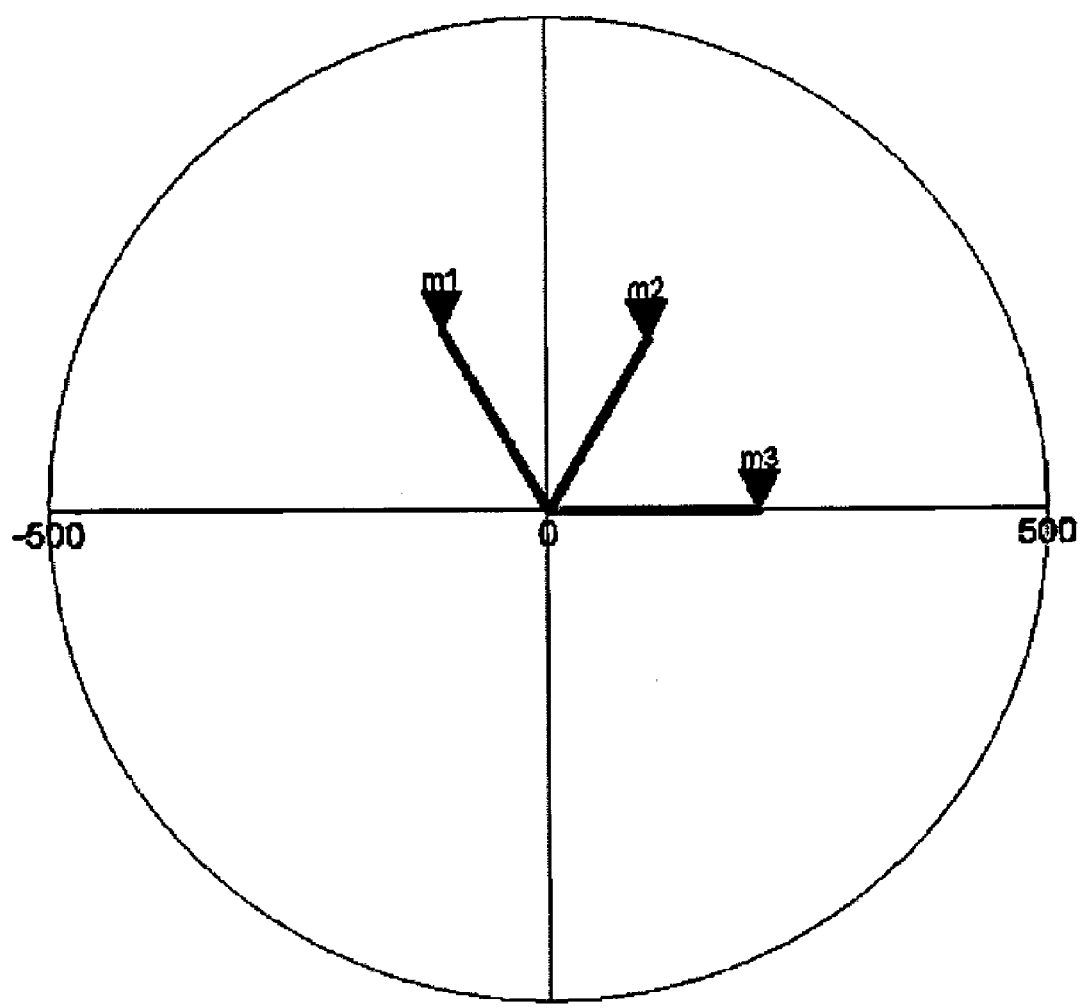
FIG. 5 illustrates the simulation result of the addition circuit according to the present invention.

FIG. 5 illustrates the result of the simulation. In FIG. 5, m1 represents the first high-frequency input signal Si1, m3 represents the second high-frequency input signal Si2, and m2 represents the third high-frequency output signal So3. The amplitude and the phase of each of those signals are expressed by using a vector. In FIG. 5, the first high-frequency input signal Si1 has the amplitude of 210.8 mV and the phase of 120°. The second high-frequency input signal Si2 has the amplitude of 210.8 mV and the phase of 0°. The third high-frequency output signal So3 has the amplitude of 199.5 mV and the phase of 60°. It is therefore understood that the first high-frequency input signal Si1 and the second high-frequency input signal Si2 are accurately vector-added, whereby the third high-frequency output signal So3 is obtained. Thus, effectiveness of the present invention has been confirmed.

REFERENCE SIGNS LIST 11 first multiplier
12 second multiplier 13 third multiplier
14 fourth multiplier
15 fifth multiplier
16 sixth multiplier
21 first adder
22 second adder
44 output terminal

The invention claimed is:

1. An addition circuit comprising:
a first multiplier multiplying a first high-frequency input signal, which is input to the first multiplier, by a first reference signal which is input to the first multiplier, and outputting a first direct-current output signal;
a second multiplier multiplying the first high-frequency input signal, which is input to the second multiplier, by a second reference signal which is input to the second multiplier and which has a phase advanced by 90° with respect to the first reference signal, and outputting a second direct-current output signal;
a third multiplier multiplying a second high-frequency input signal, which is input to the third multiplier, by the first reference signal which is input to the third multiplier, and outputting a third direct-current output signal;
a fourth multiplier multiplying the second high-frequency input signal by the second reference signal, which are input to the fourth multiplier, and outputting a fourth direct-current output signal;
a first adder adding the first direct-current output signal and the third direct-current output signal, which are input to the first adder, and outputting a fifth direct-current output signal;
a second adder adding the second direct-current output signal and the fourth direct-current output signal, which are input to the second adder, and outputting a sixth direct-current output signal;
a fifth multiplier multiplying the fifth direct-current output signal by the first reference signal, which are input to the fifth multiplier, and outputting a first high-frequency output signal;
a sixth multiplier multiplying the sixth direct-current output signal by the second reference signal, which are input to the sixth multiplier, and outputting a second high-frequency output signal; and
an output terminal connected to the fifth multiplier and the sixth multiplier and outputting a third high-frequency output signal resulting from adding the first high-frequency output signal and the second high-frequency output signal.

2. The addition circuit according to claim 1, wherein the first adder adds the first direct-current output signal, the third direct-current output signal, and a first direct-current auxiliary signal which is input to the first adder, and outputs the fifth direct-current output signal, and
second adder adds the second direct-current output signal, the fourth direct-current output signal, and a second direct-current auxiliary signal which is input to the second adder, and outputs the sixth direct-current output signal.

3. A power amplifier circuit comprising:
a constant envelope signal generating circuit converting an input signal, which has an envelop variation, to two constant envelope signals and outputting the two constant envelope signals;
two amplifiers amplifying respectively the two input constant envelope signals and outputting the two constant envelope signals after being amplified; and
the addition circuit according to claim 1, which receives the two constant envelope signals after being amplified, respectively, as the first high-frequency input signal and the second high-frequency input signal.

4. A transmission device comprising:
a transmission circuit;
the power amplifier circuit according to claim 3; and
an antenna connected to the transmission circuit through the power amplifier circuit.

5. A communication device comprising;
a transmission circuit;
the power amplifier circuit according to claim 3;
an antenna connected to the transmission circuit through the power amplifier circuit; and
recpion circuit connected to the antenna.

6. The addition circuit according to claim 1, wherein each of the first reference signal and the second high-frequency input signal has a frequency equal to a frequency of the first high-frequency input signal.

* * * * *